(12) United States Patent
Hunter et al.

(10) Patent No.: US 9,353,889 B2
(45) Date of Patent: May 31, 2016

(54) MODULAR FRAME SYSTEM AND METHOD FOR HOLDING SUBSEA EQUIPMENT

(71) Applicant: Teledyne Instruments, Inc., Thousand Oaks, CA (US)

(72) Inventors: John Bradley Hunter, Basking Ridge, NJ (US); James Widar, Deland, FL (US); Alan David McCleary, Saint Augustine, FL (US)

(73) Assignee: Teledyne Instruments, Inc., Thousand Oaks, CA (US)

( * ) Notice: Subject to any disclaimer, the term of this patent is extended or adjusted under 35 U.S.C. 154(b) by 151 days.

(21) Appl. No.: 14/258,929

(22) Filed: Apr. 22, 2014

(65) Prior Publication Data
US 2015/0300530 A1    Oct. 22, 2015

(51) Int. Cl.
| | |
|---|---|
| *E21B 7/12* | (2006.01) |
| *F16L 3/00* | (2006.01) |
| *H05K 7/10* | (2006.01) |
| *E21B 41/00* | (2006.01) |
| *E21B 41/08* | (2006.01) |

(52) U.S. Cl.
CPC .............. *F16L 3/00* (2013.01); *E21B 41/0007* (2013.01); *E21B 41/08* (2013.01); *H05K 7/10* (2013.01)

(58) Field of Classification Search
CPC ...... E21B 41/0007; E21B 41/08; F16L 1/123; F16L 3/00
USPC ........................................ 166/360, 79.1, 96.1
See application file for complete search history.

(56) References Cited

U.S. PATENT DOCUMENTS

| | | | |
|---|---|---|---|
| 3,401,746 A | | 9/1968 | Stevens |
| 3,718,307 A | * | 2/1973 | Albanese .................... 248/57 |
| 3,848,639 A | * | 11/1974 | Chen ........................ 138/103 |
| 3,913,669 A | | 10/1975 | Brun et al. |
| 3,934,658 A | * | 1/1976 | Nelson ........................ 175/7 |
| 4,023,619 A | | 5/1977 | Marquaire et al. |
| 4,039,025 A | | 8/1977 | Burkhardt et al. |
| 4,194,857 A | | 3/1980 | Chateau et al. |
| 4,273,472 A | | 6/1981 | Piazza et al. |
| 4,398,846 A | | 8/1983 | Agdern |
| 4,426,173 A | | 1/1984 | Richart et al. |
| 4,625,805 A | | 12/1986 | Ladecky |
| 4,753,552 A | | 6/1988 | Karal et al. |
| 5,176,471 A | | 1/1993 | Frafjord et al. |
| 5,255,744 A | | 10/1993 | Silva |
| 6,182,763 B1 | | 2/2001 | Ingebrigtsen et al. |
| 6,644,410 B1 | | 11/2003 | Lindsey-Curran et al. |
| 2003/0141077 A1 | | 7/2003 | Crain et al. |
| 2012/0279720 A1 | | 11/2012 | Whitbey et al. |

OTHER PUBLICATIONS

Aker Solutions. "Tree running tool." pp. 3-4, Feb. 17, 2011.
(Continued)

*Primary Examiner* — Matthew R Buck
*Assistant Examiner* — Aaron Lembo
(74) *Attorney, Agent, or Firm* — Procopio, Cory, Hargreaves & Savitch, LLP

(57) ABSTRACT

A modular subsea equipment assembly including a modular base frame and a plurality of modular superstructure devices for selective attachment to the modular base frame for supporting various components and for attachment to underwater cables. The modular base frame includes a frame member forming an outer periphery of the base frame, and a plurality of cross bars extending between opposite portions of the frame member in one or more directions, the frame member and cross bars having at least upper surfaces each having a plurality of connection points for attaching selected modular devices of the assembly to the base frame in a plurality of different possible configurations.

24 Claims, 14 Drawing Sheets

(56) References Cited

OTHER PUBLICATIONS

Barlow et al. "Latest Generation Subsea Observatory Standards—A Systems Architecture Review." Proc. Oceans Conference. Sep. 29, 2007-Oct. 4, 2007, pp. 1-5.

Oceanworks International. "NODE-3000 Specification." 2 pages, 2012.

Waterworth et al. "Connecting Long Term Sea Floor Observatories to the shore." Sea Technol. 45(9):10-13 (2004).

Extended European Search Report for European Patent Application No. 15159851.3 mailed on Nov. 11, 2015 in 6 pages.

* cited by examiner

MODULAR FRAME SYSTEM AND METHOD FOR HOLDING SUBSEA EQUIPMENT

BACKGROUND

1. Field of the Invention

The present invention relates generally to support or mounting systems for holding various types of equipment in a subsea environment, such as electronics or instrument modules and the like associated with oil production installations, subsea communication systems, subsea pumping stations, and the like.

2. Related Art

Subsea nodes are subsea installations which distribute power or send and receive communications between a shore based facility and equipment or instruments installed at the nodes via one or more electrical, optical, or electro-optical cables extending from the shore based facility and the node, and may also send and receive communications between the node and other subsea nodes or installations. Support frames or systems for holding underwater equipment or instruments in a node architecture are sometimes known as node frames, and are typically one of a kind items which are custom designed for specific equipment installations. They are generally of welded construction and produced in small quantity. This makes such support systems costly and difficult to acquire.

SUMMARY

In one aspect, a modular subsea equipment assembly is provided which comprises a modular base frame or node frame, and a plurality of modular superstructure devices for selective attachment to the modular base frame for supporting various components or for attachment to underwater cables. The modular base frame in one embodiment comprises a frame member forming an outer periphery of the base frame, and a plurality of cross bars extending between opposite portions of the frame member in one or more directions, the frame member and cross bars having at least upper surfaces each having a plurality of connection points for attaching selected modular devices of the assembly to the base frame in a plurality of different possible configurations. In one embodiment, the connection points comprise a plurality of spaced mounting holes or bores in the frame member and cross bars for receiving threaded or non-threaded fasteners, such as screws, bolts, rivets, nails, pins and the like. The base frame in one embodiment is square or rectangular in shape, although base frames in other embodiments may have shapes such as circular, polygonal or the like.

In one embodiment, the peripheral frame member has opposite sides and opposite ends, with one or more first cross bars extending between the sides and one or more second cross bars extending between opposite ends of the frame transverse to the first cross bars. The cross bars may be of the same width as the peripheral frame member or of different widths. In one embodiment, a central, wider cross bar is provided which has two parallel rows of spaced connection points. The multiple supports and many spaced connection points thus provided allow for multiple different possible equipment configurations by allowing many different possible configures or placements of superstructure devices with mounting plates of different sizes at different locations on the base frame.

In one embodiment, the superstructure devices comprise one or more of the following: mounting brackets for supporting cable connector plates or modules carrying different numbers of subsea connector units for attachment of mating connector units at the ends of underwater cables, yoke mounts for both fixed and swivel attachment to cable terminations, support brackets for supporting electronics modules, modular equipment housings, high and low U-shaped support members, top cable brackets, and one or more top covers or cowlings. At least some of the superstructure devices have base plates or mounts with openings at a spacing corresponding to the connection point spacing on the modular base frame, so that they can be aligned with connection points on the upper surface of the base frame in multiple possible positions. The overall modular frame assembly or system is designed to be trawl and snag resistant when used for assembly of any combination of components in a subsea system. The top cover or cowling has spaced openings around a base portion designed for alignment with openings or connection points around the peripheral frame member.

In one embodiment, a method of assembling multiple different selected configurations of subsea equipment on a modular base frame is provided. The base frame has a peripheral frame member and one or more cross members or cross bars extending between opposite portions of the peripheral frame member, the frame member and cross bar or bars having plural, equally spaced connection points extending along at least a major portion or the entire length of the respective members. In one embodiment, the method comprises positioning one, two or more modular superstructure devices of different types at selected locations on the upper surface of the peripheral frame member with an array of spaced connection points on the base mount of each modular superstructure device aligned with a selected matching array of spaced connection points on the base frame, and securing each modular superstructure device to the frame via the aligned connection points.

In one embodiment, the connection points on the base frame are mounting holes and the connection points on each mounting base are openings for alignment with selected mounting holes, and each modular superstructure device is secured to the base frame via fasteners extending through each opening and the aligned mounting hole. The mounting holes may be threaded for receiving threaded fasteners such as screws or bolts, or unthreaded for receiving fasteners such as pins, rivets or nails. In one embodiment, the modular superstructure devices comprise at least pivotal and fixed yoke mounting brackets for cable terminations, end brackets for supporting equipment modules holding various types of equipment, end brackets for supporting cable connector manifold plates carrying two or more subsea connector units for subsea mating engagement with mating connector units at the ends of subsea cables or the like, and U-shaped supports for supporting additional devices at a raised height above the base frame, such as a lowering and lifting cable clevis or a swivel cable termination. In one embodiment, once the selected superstructure devices and any associated electronics modules, cable terminations, lifting and handling fixtures or the like are secured in a selected one of multiple possible configurations on the base frame, a trawl resistant cover member or cowling is secured over the assembly, with an inwardly directed rim around the base of the cover member seated on the peripheral frame member with spaced connection points or fastener openings around the base of the cover member aligned with corresponding spaced connection points or mounting holes around the peripheral frame member of the base frame, and a lowering and lifting cable extending out of a top opening of the attached cover member or cowling.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

Certain embodiments as disclosed herein provide for a modular subsea equipment assembly or mounting frame system. The modular subsea equipment assembly or modular frame system may include a modular base frame and a plurality of modular superstructure devices for selective attachment to the modular base frame in multiple possible different configurations for supporting various components and for attachment to underwater cables. The modular frame system may further include a cowling or top cover for attachment over the superstructure devices and equipment after attachment to the modular base frame.

After reading this description it will become apparent to one skilled in the art how to implement the invention in various alternative embodiments and alternative applications. However, although various embodiments of the present invention will be described herein, it is understood that these embodiments are presented by way of example only, and not limitation. As such, this detailed description of various alternative embodiments should not be construed to limit the scope or breadth of the present invention.

Figure 1A:
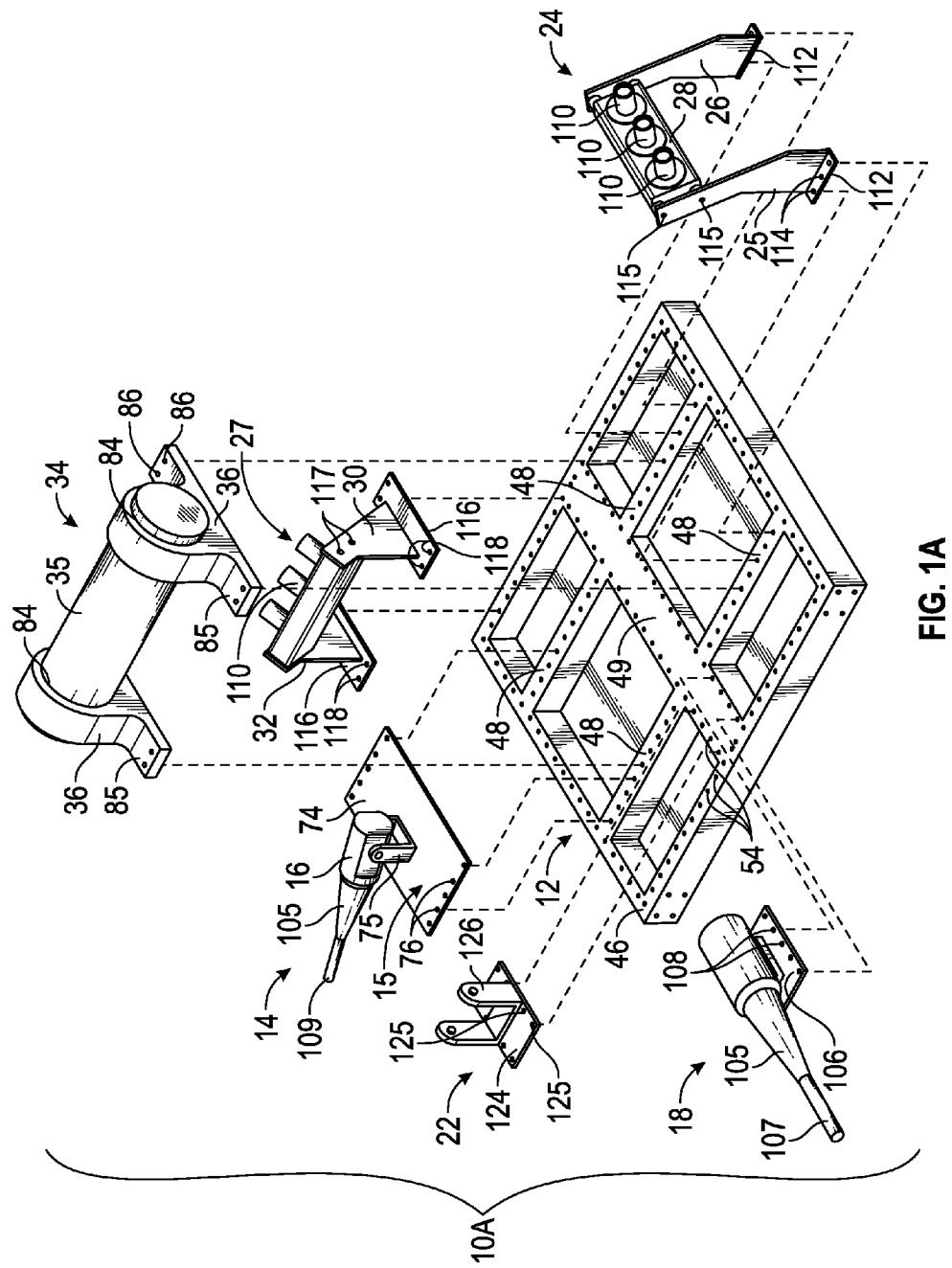
FIGS. 1A and 1B are exploded views of the parts of one embodiment of a modular frame system for supporting subsea equipment in a variety of different possible configurations.
Figure 1B:
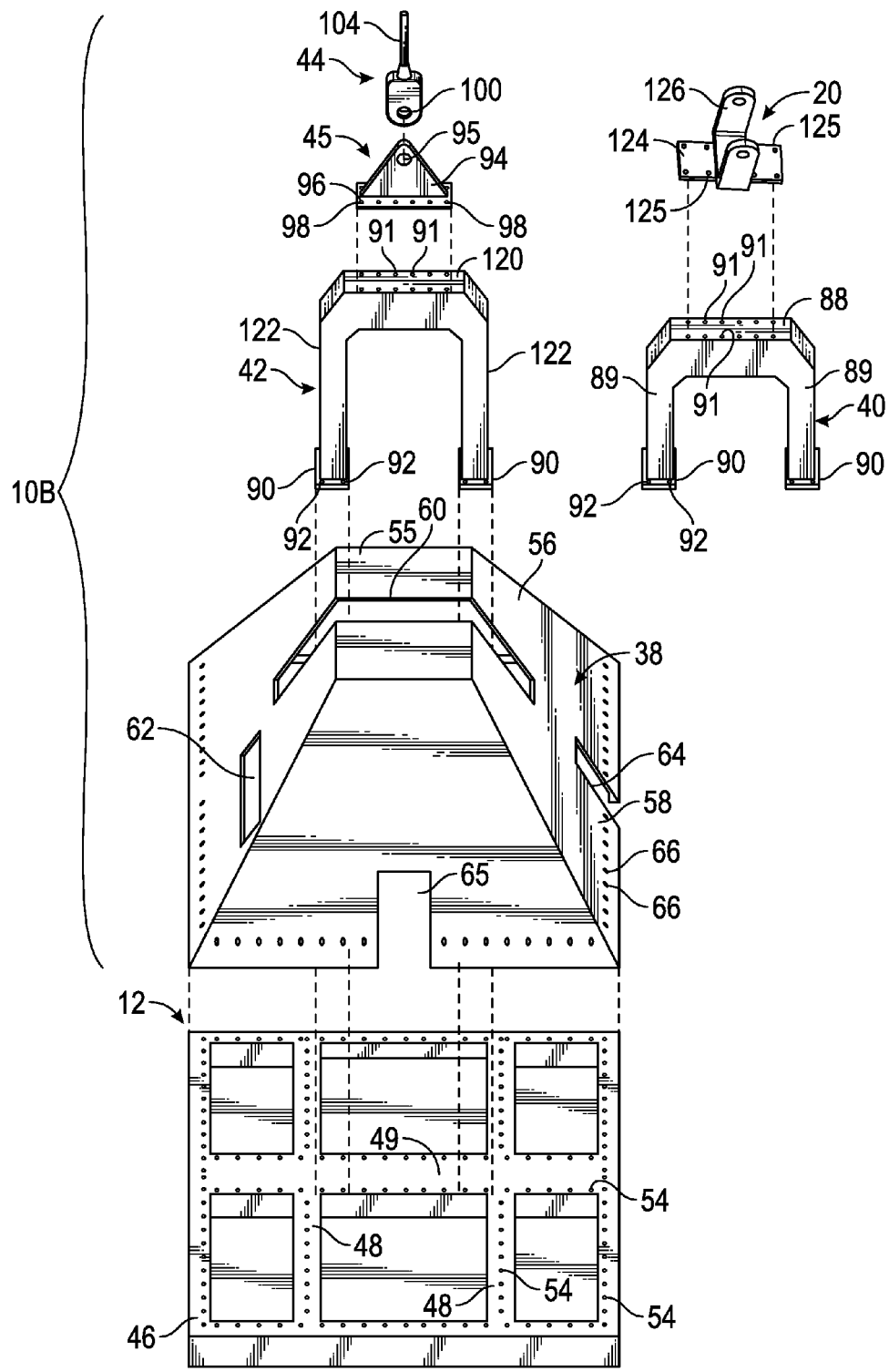

FIGS. 1A and 1B illustrate exploded views of the parts of one embodiment of a modular frame system or kit 10A, 10B for supporting subsea equipment in a variety of different possible configurations. Modular frame system or kit 10A, 10B basically comprises a modular base frame 12 which functions as a base plate to install various subsea equipment, and a plurality of different superstructure devices or equipment mounting devices for mounting at selected positions on the base frame or on other superstructure devices. Base frame 12 is included in both FIG. 1A and FIG. 1B to illustrate alignment with various superstructure devices of the system or kit. The modular base frame is designed so that the superstructure devices can be mounted in multiple different possible configurations on the frame, as described in more detail below.

Figure 2:
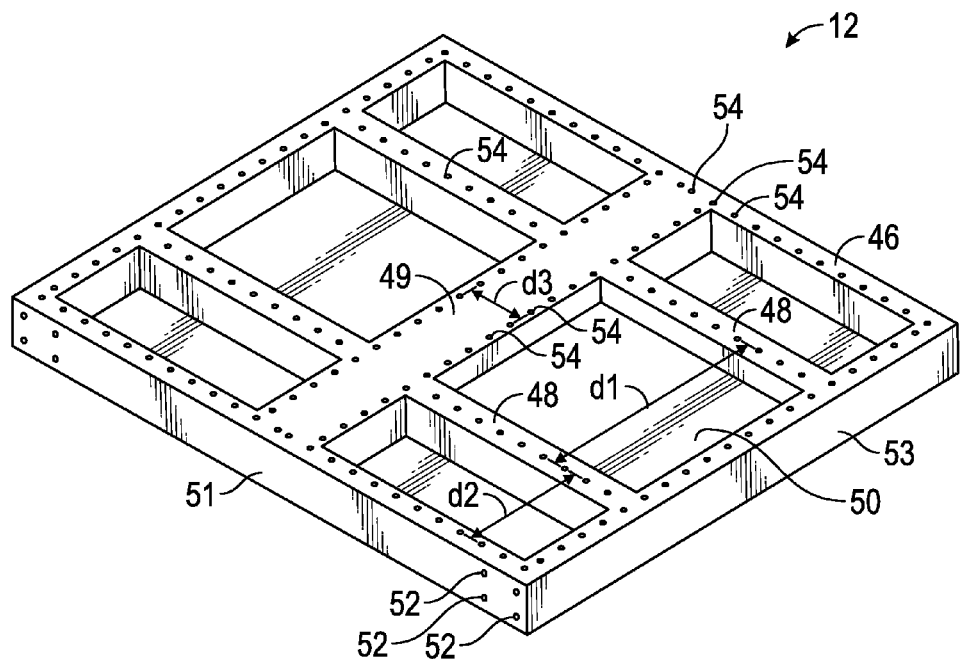
FIG. 2 is a top perspective view of the modular base frame of the modular frame system of FIG. 1, on a larger scale.
Figure 3:
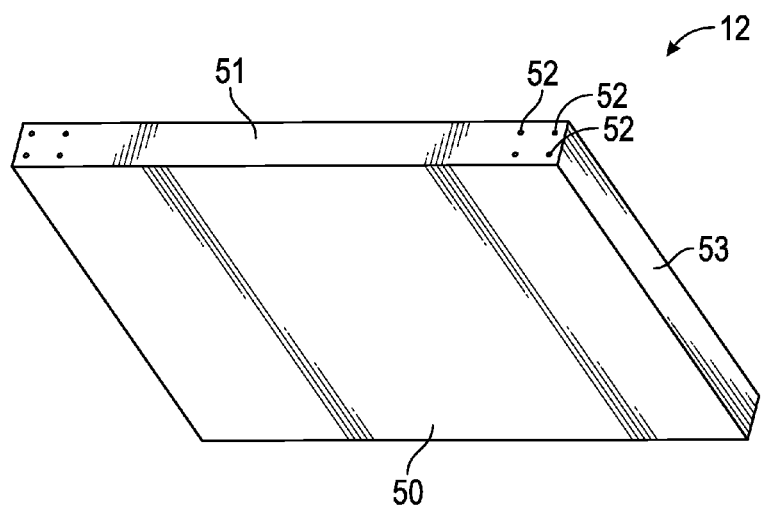
FIG. 3 is a bottom perspective view of the base frame of FIG. 2.

FIG. 2 and FIG. 3 illustrate one embodiment of the base frame of the system of FIG. 1A and FIG. 1B in more detail. Base frame 12 includes a frame member 46 forming an outer periphery of the base frame, sometimes referred to as frame periphery. Base frame 12 further includes a plurality of cross bars extending between opposite portions of the frame periphery 46 in one or more directions. In the illustrated embodiment, the base frame is generally rectangular with opposite sides and opposite ends, but it may be of other shapes in alternative embodiments, such as polygonal or round. Frame member 46 has a pair of cross bars 48 extending between opposite ends and a single, central cross bar 49 extending transverse to cross bars 48 between opposite sides, but different numbers of cross bars may extend between the sides and ends of the frame member in other embodiments. In the illustrated embodiment, cross bars 48 are slightly wider than the peripheral frame member 46, while central cross bar 49 is around twice the width of cross bars 48. Openings or recessed areas are provided between the respective cross bars and side and end portions of the frame member 46, and a base plate 50 may extend across the lower surfaces of the frame member and cross bar and lower ends of the recessed areas, as seen in FIG. 3, for positioning or planting on the sea floor.

The upper surface of the peripheral frame member has a series of spaced connection points or mounting holes 54 around the entire frame periphery, and cross bars 48 each have a plurality of similar connection points 54 along their upper surfaces between each end of the frame and the intersection with the central, wider cross bar 49. The wider cross bar 49 has two parallel, spaced rows of connection points 54 extending adjacent opposite sides of the cross bar between the opposite sides of the frame member or frame periphery. The spacing between connection points is constant around the periphery of the frame as well as along each cross bar.

The connection points 54 in one embodiment are mounting holes or fastener openings populating around the top surface of base frame 12. Mounting holes 54 may be threaded or unthreaded, and may receive fasteners such as screws, bolts, pins, nails, rivets, and the like. Superstructure devices may generally include brackets or base plates located at the bottom of the devices and having openings configured for alignment with the mounting holes or fastener openings 54 to receive fasteners to attach various devices to base frame 12, as described in more detail below.

Figure 12:
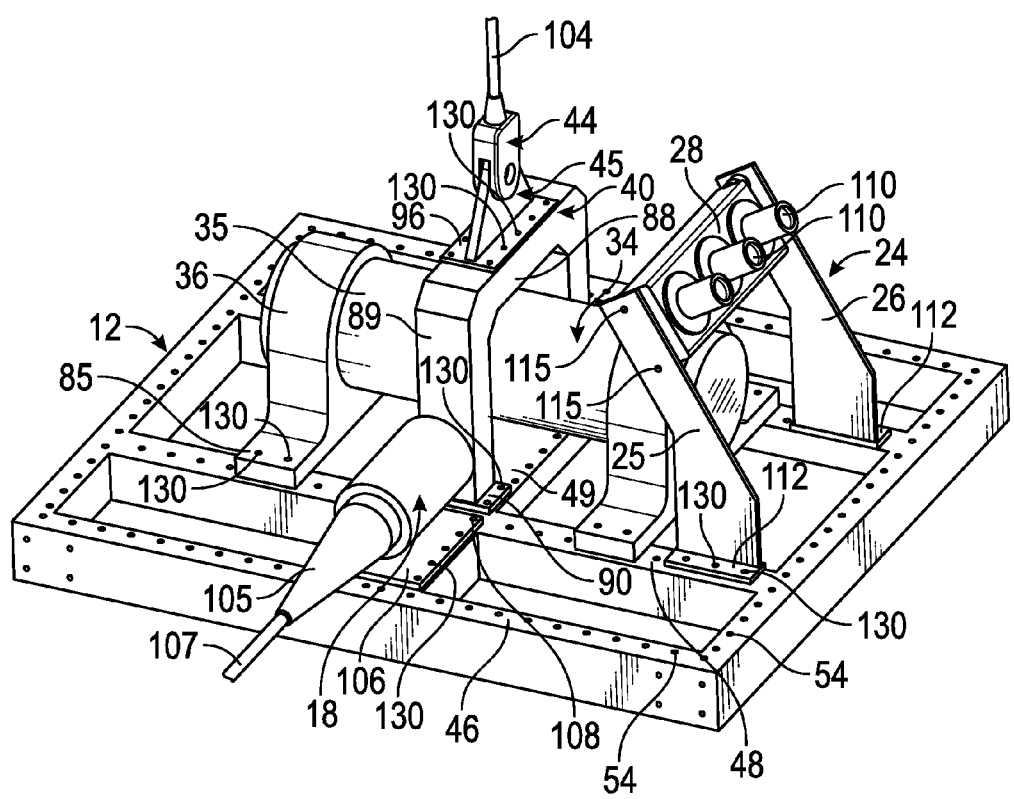

Opposite sides and ends of base frame 12 may include side face 51 and end face 53 and corresponding opposite faces of base frame 12. Fastener openings or connection points 52 may also be provided on the side or end faces, as seen in FIG. 12, for example to permit attachment to a cover member or to additional lifting or handling structures. The multiple cross bars and many spaced connection points of base frame 12 allow for multiple different possible equipment configurations by allowing many different possible configurations or placements of superstructure devices with mounting plates of different sizes at different locations on the base frame. For example, superstructure devices may be installed onto one side of frame periphery 46 and a cross bar 48, whereas other superstructure devices may be installed entirely on central cross bar 49. As illustrated in FIG. 2, the mounting holes 54 in the peripheral frame member and cross bars combine to form various mounting or connection point arrays comprising spaced rows of mounting holes at different spacings, for example spacing d1 between the two cross bars 48, spacing d2 between a cross bar and adjacent side portion of the peripheral frame member 46, and spacing d3 between the two rows of mounting holes in the central cross bar 49. In the illustrated embodiment, the spacing between one of the rows of mounting holes at either side of central cross bar 49 and the mounting holes at the adjacent end of peripheral frame member 46 is also equal to d1. The mounting hole arrays can be used in groups of two, three, four or more mounting holes, depending on dimensions of a superstructure device mounting plate or mounting base which has two rows of openings at a spacing corresponding to d1, d2 or d3, or d1+d2, with the openings in each row spaced apart by the same distance as mounting holes 54. This provides a large amount of flexibility in selection of mounting positions for various modular superstructure devices. Base frame 12 may be designed with additional cross bars at different spacings in alternative embodiments, if more flexibility for mounting of different size base plates or mounts is needed.

Base frame 12 may also include a lower wall 50 on the underside of base frame 12 for planting into the sea floor. In general, base frame 12 is composed of a suitable high strength, corrosion resistant metal.

As illustrated in FIG. 2, base frame 12 has a generous supply of mounting holes 54 for securing various superstructure components or devices, such as electronics modules, undersea mateable connectors, swivel and fixed undersea cable terminations, and lifting hardware, in multiple different possible configurations.

Some of the superstructure components or devices of one embodiment of a subsea installation system or kit are illustrated in FIG. 1A positioned over possible mounting positions on the base frame, while other superstructure components/mounting devices 10B are illustrated in FIG. 1B in appropriate positions over base frame 12. The superstructure devices may include cable swivel termination 14, fixed cable termination 18, yoke side mount 22, subsea electronics or equipment module (SEM) assembly 34 comprising end brackets or mounts 36 supporting subsea electronics or equipment module 35, tall cable connector assembly 24 with tall modular end brackets 25, 26 supporting cable connector manifold or plate 28, and short cable connector assembly 27 with shorter modular end brackets 30, 32 also supporting a cable connector manifold or plate 28, as seen in FIG. 10A, as well as cable clevis 44, top cable bracket 45, yoke top mount 20, low support 40, high support 42, and top cover or cowling 38, as seen in FIG. 1B. In general, each of the superstructure devices 10A and 10B apart from the top cover or cowling 38 has one or more connector base plates with openings positioned for alignment with a selected group of openings 48 in the peripheral frame member 46 and one or more cross bars 48 or 49.

The majority of the superstructure devices in FIGS. 1A and 1B are built up from one or more modular components, including base plates or mounting bases of different sizes and with different arrangements of fastener openings at spacings equal to fastener opening or mounting hole spacings on base frame 12. The assembly or kit includes a number of cable mounting devices, specifically fixed cable termination 18, yoke end mount 15 and yoke side mount 22 of FIG. 1A, and yoke top mount 20 of FIG. 1B. In FIG. 1A, yoke end mount 15 is part of cable swivel termination 14, in which a swivel mount cable termination 16 is pivotally mounted on yoke end mount 15. A cable termination 16 may also be pivotally mounted on yoke top mount 20, for example as illustrated in the installation example of FIGS. 19 and 20. Yoke end mount 15 has a base or mounting plate 74 with fastener openings 76 along each end of the plate, and a U-shaped yoke or mounting bracket 75 secured to a central region of the plate, with the cable termination 16 pivotally mounted between opposite sides of the yoke. As illustrated by the dotted lines in FIG. 1A, the spacing between the two rows of fastener openings 76 at opposite ends of plate 74 is equal to spacing d1 between the two rows of mounting holes 54 in frame cross bars 48, so that plate 15 can be secured across cross bars 48 at either end of the frame for termination of a cable to be connected to equipment in the node, or two plates 15 can be secured at opposite ends of the frame if needed based on system requirements.

Yoke side mount 22 is similar to yoke end mount 15 but has a smaller mounting plate 124 and a U-shaped yoke 126 mounted with its pivot axis parallel with the opposite ends of the plate, rather than transverse to the ends of the mounting plate as in yoke end mount 15. A cable termination 16 (not illustrated) can be pivotally mounted in yoke 126 in a similar manner to the cable swivel termination 16 on yoke end mount 15 in FIG. 1A. In this case, fastener openings 125 are provided along opposite sides of plate 124 on opposite sides of the yoke 126. Yoke top mount 20 (FIG. 1B) is similar to side yoke mount 22 and like reference numbers are used for like parts as appropriate. The spacing between openings 125 on opposite sides of the plate 124 of yoke side mount 22 (and between openings 125 on yoke end mount 20) is equal to spacing d3 between the two rows of mounting holes on opposite sides of central cross bar 49, and thus the yoke end mount can be secured to any selected group of mounting holes on bar 49, for example at either end of bar 49 for pivotal mounting of a cable termination. Fixed cable termination 18 has a base plate 106 with two rows of fastener openings 108 on opposite sides of the plate also at a spacing equal to d1, and this module can also be secured at any desired location on central cross bar 49.

Other superstructure or modular components comprise brackets for supporting electronics modules such as short brackets 30, 32 and tall brackets 25, 26 which may be used for mounting cable connector modules or plates 28 to form cable connector manifolds 27, 24, respectively, modular electronics equipment housings such as SEM vessel 35, SEM vessel end support brackets 36, high and low U-shaped support members such as low support 40 and high support 42, top cable bracket 45 for pivot mounting of cable clevis 44 to which an end of installation deployment (lowering) cable or rope 104 is secured, and one or more top covers or cowlings such as cowling 38.

FIG. 1A illustrates two cable connector plates or manifolds 28. One of the cable connector plates is secured between right and left tall brackets 25, 26 via fasteners 115 forming assembly 24. Each bracket has a flat base plate or foot plate 35 with a row of fastener openings 114, and when the brackets are secured to opposite ends of the cable connector plate 28, the spacing between fastener openings in the two foot plates 35 is equal to the spacing d1 between fastener openings or mounting holes 54 on the cross bars 48, as seen by the dotted lines in FIG. 1A. The other cable connector plate is secured by fasteners 117 between right and left short brackets 30, 32, which are shorter than tall brackets 25, 26. Short brackets 30, 32 also each have a foot plate 116, with openings 118 at each end of the respective foot plate. The spacing between the openings 118 at opposite ends of the foot plates 116 of the short brackets 30, 32 is equal to the spacing d2 between a row of openings on a cross bar 48 and a row of openings on an adjacent side of peripheral frame member 46 (see FIG. 1A). Each cable connector plate or manifold 28 in FIG. 1A has three cable connectors 110, but cable connector plates with a greater or lesser number of connectors, in one row or more rows between the end brackets, may be provided in other embodiments, depending on the number of cables to be connected to the node installation. Subsea cable connector units or sockets 110 may be positioned on one face of connector plate 28. Sockets or connector units 110 may be subsea, oil-filled, pressure balanced connector junctions for underwater/subsea cables. Such socket or connector units may be plug or socket units. The units are sealed shut against sea water when unmated, as well as when mated with a mating connector half (plug or socket) at the end of a subsea cable which may be suitably connected to connector plate 28 via an ROV or the like after installation on the sea floor, while the cable connectors 110 are connected to equipment installed inside the assembly.

SEM vessel end support brackets 36 each have an opening 84 for receiving a respective end of SEM vessel 35, as seen in FIG. 1A, and a base mount or base plate 85 extending transverse to the longitudinal axis of SEM vessel 35, with fastener openings or holes 86 at opposite ends of each base plate 85 at a spacing d1 for alignment with corresponding mounting holes 54, for example in cross bars 48 as seen in FIG. 1A. U-shaped short bracket 40 has a pair of side members 89 and an upper member 88 extending between the side members, with the top surface of member 88 comprising a mounting surface for a component of the assembly. The top surface has two rows of spaced fastener openings or mounting holes 91 which may be identical to mounting holes 54 in the base frame and at the same spacing as connection points or mounting holes 54. Tall mounting bracket 42 is similar in shape to bracket 40 but has taller side members 122 with a top member 120 extending between the side members. As with top member 88, top member 120 forms a mounting surface and has two rows of fastener openings or holes 91 at the same spacing as the fastener openings on top member 88. Both brackets 40 and 42 have mounting plates or feet 90 at the lower ends of the side members 89 and 122, and each mounting plate has fastener openings or mounting holes 92 at opposite ends at a spacing d3, positioned for alignment with spaced mounting holes 54 in the two rows on the central cross bar 49, as discussed in more detail below.

FIG. 1B also illustrates top cable bracket or mounting device 45 which can be secured to the top of either the short or the tall mounting bracket 40 or 42. Cable bracket 45 has a base plate 96 on which a triangular bracket 94 is mounted. Bracket has an opening 95 at its upper end which can be aligned with openings 100 on spaced sides of cable clevis 44, from which a cable 104 extends for use in lowering or raising the installation. Clevis is secured to bracket 94 via a suitable fastener 102 (FIG. 11) extending through aligned openings 100 and 95. Base plate 96 has a series of fastener openings or holes 98 extending on opposite sides of triangular bracket 94, at a spacing equal to the spacing between the rows of connection points or mounting holes 91 in the upper surface of mounting bracket 40 or 42. Yoke top mount 20 may also be selectively mounted on the top surface of either short or tall mounting bracket 40 or 42, with openings 125 aligned with openings 91 in respective rows on top member 88 or 120, and a cable with a swivel end mount may be pivotally secured to yoke 126 for lowering the completed system to the ocean floor, as described in more detail below with reference to FIGS. 9, 18 and 19.

Some of the components above may be mounting devices, such as mounting brackets, yoke mounts, supporting electronics module brackets, and U-shaped support members. Furthermore, each superstructure mounting device has connection points, such as bolt holes, designed for alignment with connection points on the upper surface of the base frame. The connection points on the peripheral frame member 46 and cross bars 48, 49 of base frame 12 together form multiple possible mounting positions of different sizes and with different numbers of connection points. The overall modular frame assembly or system is designed to be trawl and snag resistant when used for assembly of any combination of components in a subsea system.

Figure 4:
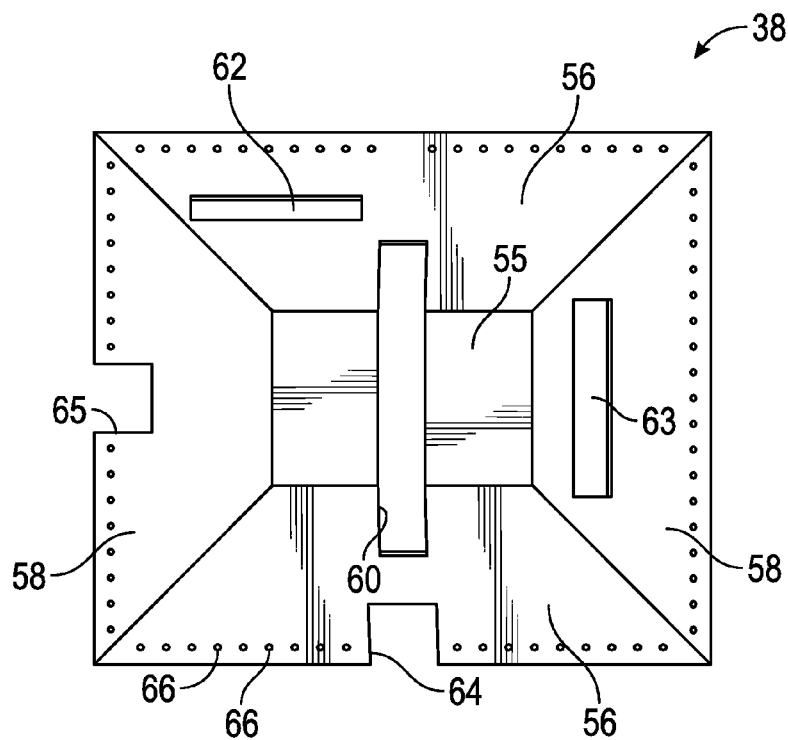
FIG. 4 is a top plan view of the cowling or cover member of FIG. 1B.
Figure 5:
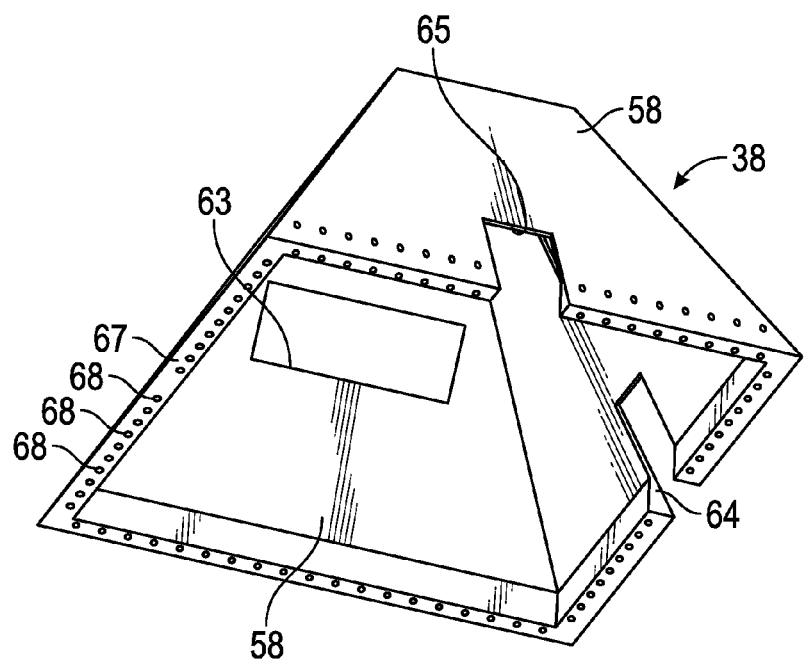
FIG. 5 is a bottom perspective view of the cowling of FIGS. 1B and 4.
Figure 7:
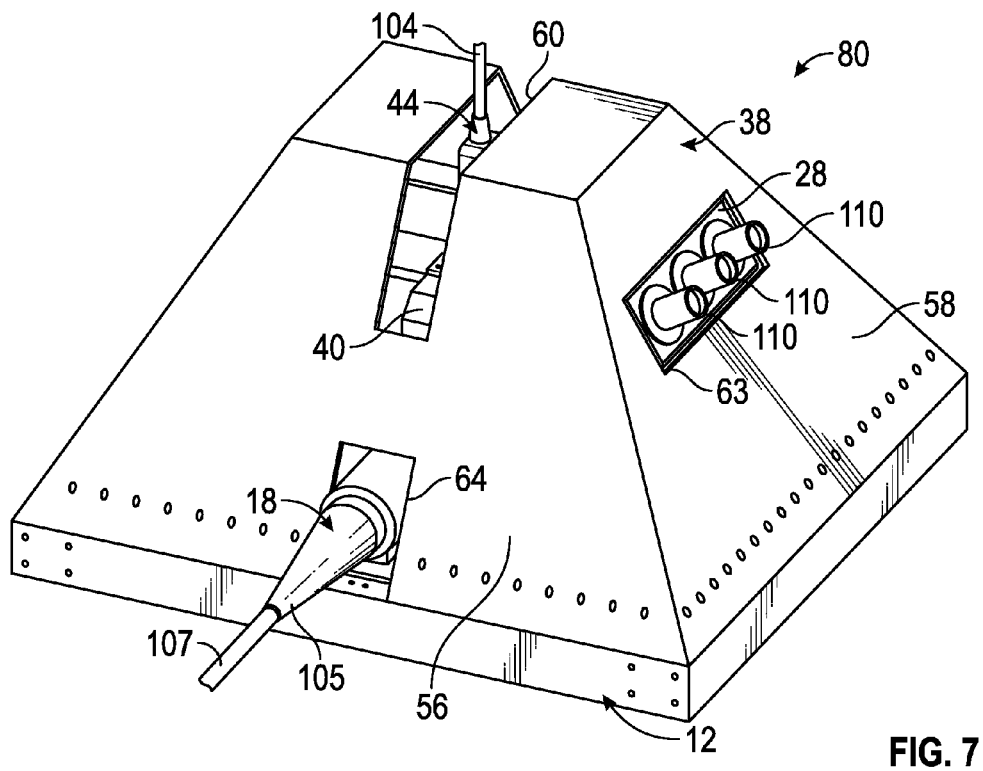
FIG. 7 is a perspective view illustrating one example of a simple, cable or rope-lowered subsea equipment installation using components of the modular frame system of FIGS. 1 to 5.

FIG. 4 illustrates a top plan view of cowling 38 while FIG. 5 illustrates a bottom perspective view. Cowling 38 is generally the shape of a truncated square pyramid having two inclined side walls 56, two inclined end walls 58, and a top wall 55. An inwardly extending, peripheral rim 67 extends around the lower ends of walls 56, 58 and is horizontal or parallel to top wall 55. Cowling 38 may also include multiple windows, such as side (or end) slots 62 and 63, and top slot 60. Cowling 38 may also include multiple openings or slots extending upward from the lower end of the cowling, such as side opening 64 and end opening 65. Generally rectangular lower rim 67 has multiple fastener openings 68. Lower rim 67 is of equivalent rectangular dimensions to the upper surface of the peripheral frame member 46 of base frame 12, so that the rim can be seated directly on top of frame member 46, as seen in FIG. 7, and the fastener openings 68 are then automatically aligned with corresponding mounting holes or fastener openings 54 spaced around the upper surface of peripheral frame member 46. Fastener openings 68 are also aligned with respective rows of fastener openings 66 extending around lower end portions of each side wall and end wall. Aligned fastener openings 66, 68 may be used to secure cowling 38 onto the upper surface of a base frame via suitable fasteners extending through openings 66, 68 into the aligned fastener openings or mounting holes 54 in the base frame.

Figure 6:
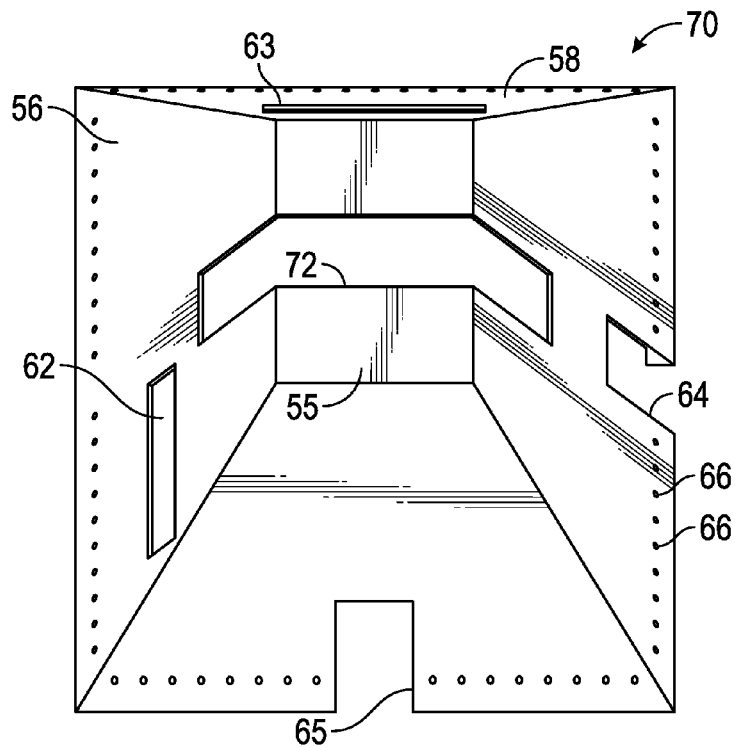
FIG. 6 is a top perspective view illustrating a modified cowling or cover member.

FIG. 6 illustrates a top perspective view of a modified cowling or cover member 70. In certain embodiments, modified cowling 70 may feature similar components as cowling 38. Modified cowling 70 may feature different sized windows or openings. For instance, top slot 72 may be wider than top slot 60 of cowling 70. This may allow for bigger components to extend through the wider top slot 72. Other parts of cowling 70 are identical to those of cowling 38, and like reference numbers have been used for like parts as appropriate. Other cowlings may be provided with different opening arrangements, positions and sizes. Each cowling or cover member, such as cowling 38 and 70, comprises a solid, smooth exterior shell that is trawl and snag resistant. The smooth exterior may limit the amount of snag points which could catch the trawl of a fishing vessel trawler.

Figure 8:
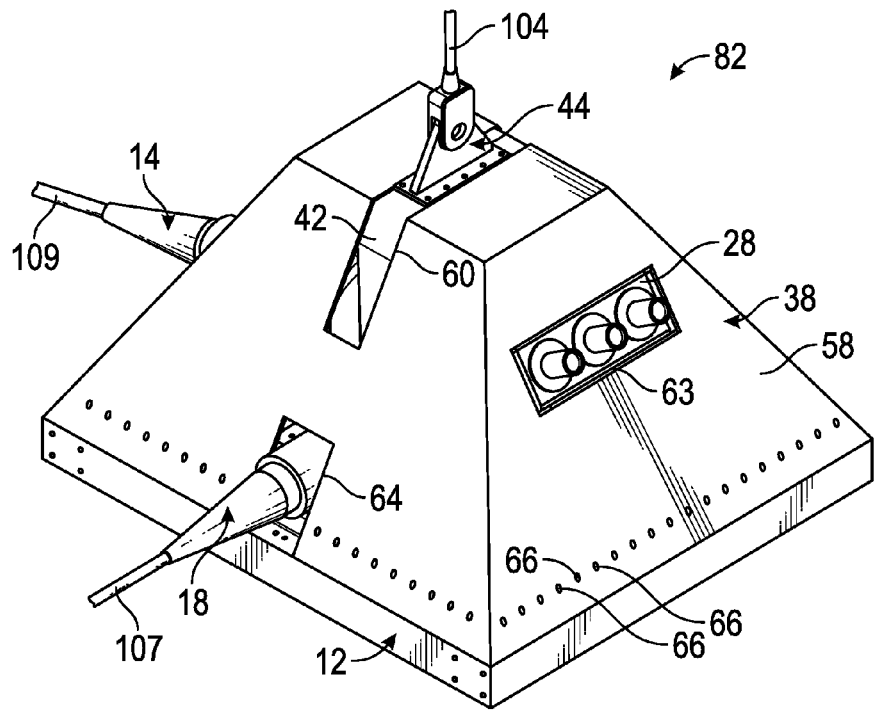
FIG. 8 is a perspective view illustrating a second example of a cable or rope-lowered subsea equipment assembly installation using the components of the modular frame system of FIGS. 1 to 5.
Figure 9:
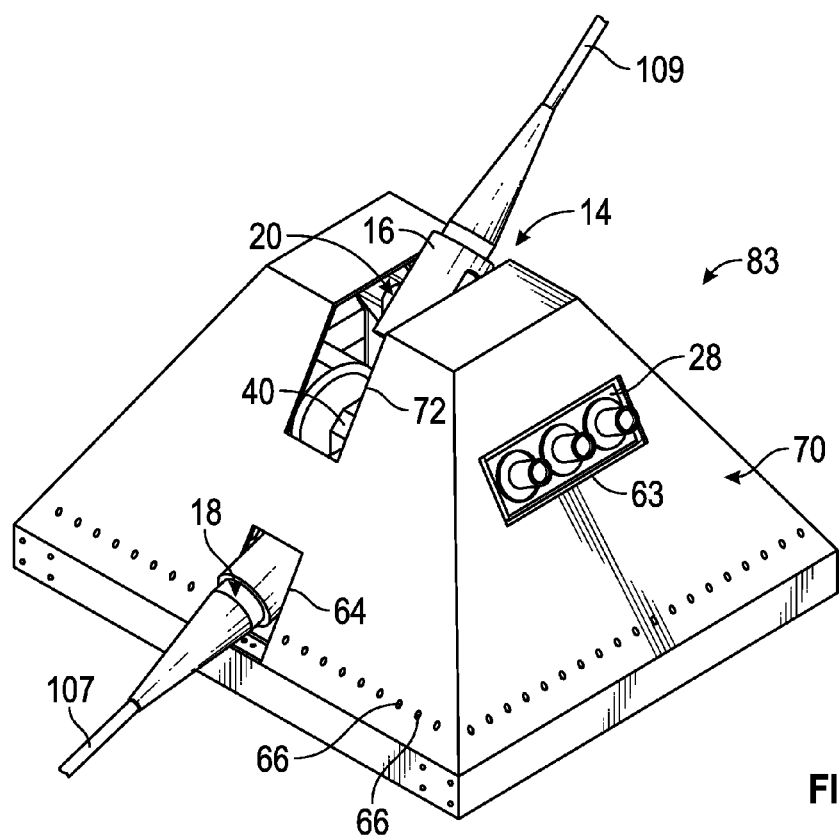
FIG. 9 is a perspective view illustrating an example of a subsea equipment assembly installation having a top cable swivel using components of the modular frame system of FIGS. 1 to 3 with the modified cowling or cover member of FIG. 6.

FIGS. 7 to 9 illustrate examples of cable or rope-lowered subsea equipment assemblies or node units 80, 82, 83 using at least some components of the modular frame system of FIGS. 1 to 6, while FIGS. 10 to 19 illustrate some possible steps in assembling these exemplary units. The equipment assemblies may be deployed offshore with a shore bound submarine cable to supply power and control. In the example of FIG. 7, simple representative assembly 80 includes the cowling 38 attached to base frame 12. Within cowling 38 and also attached to base frame 12 are several superstructure devices which may assembled onto base frame 12 in some embodiments, including the devices illustrated in FIGS. 10 to 12, as described in more detail below. In FIG. 7, some of the devices installed inside cowling 38 can be seen extending out of openings in the top wall and a side wall and end wall, while other devices extending out through openings in the other side and end walls are not visible in this view. As seen in FIG. 7, fixed cable termination 18 is attached on one side of base frame 12 and extends out through opening 64 in one side wall 56 to connect to cable 107 via cable boot 105. Connector plate 28 is attached to one side of base frame 12 perpendicular to fixed cable termination 18, and has sockets or connector units 110 extending through side opening 63 in one end wall 58. A second connector plate 28 may be attached to the opposite side of base frame to fixed cable termination 18 with connector units 110 extending through opening 62 in the opposite side wall 56. A swivel or fixed cable termination may also be secured to the opposite end of base frame 12 to extend out of opening 65 and connect to cable 109 via a cable boot 105. Suitable internal fiber or wire connector units (not illustrated) are provided on the inner ends of cable terminations 14 and 18. Low support 40 is attached near the center of base frame 12. A cable clevis 44, connected to low support 40, may extend through top slot 60 of cowling 38, with lowering cable 104 extending downward from a vessel and secured to cable clevis 44 through slot 60. Each superstructure device or equipment mounting device be attached by fastening bolts or similar fasteners through mounting holes 54, as described in more detail below.

Figure 10:
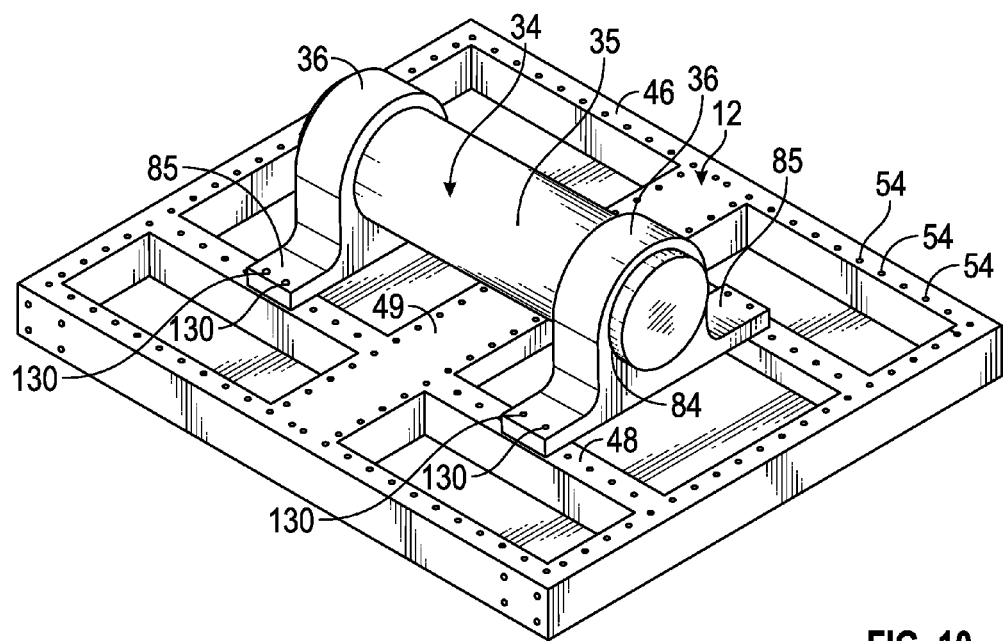
FIGS. 10 to 12 illustrate successive steps of assembling one embodiment of the equipment assembly of FIG. 7.
Figure 11:
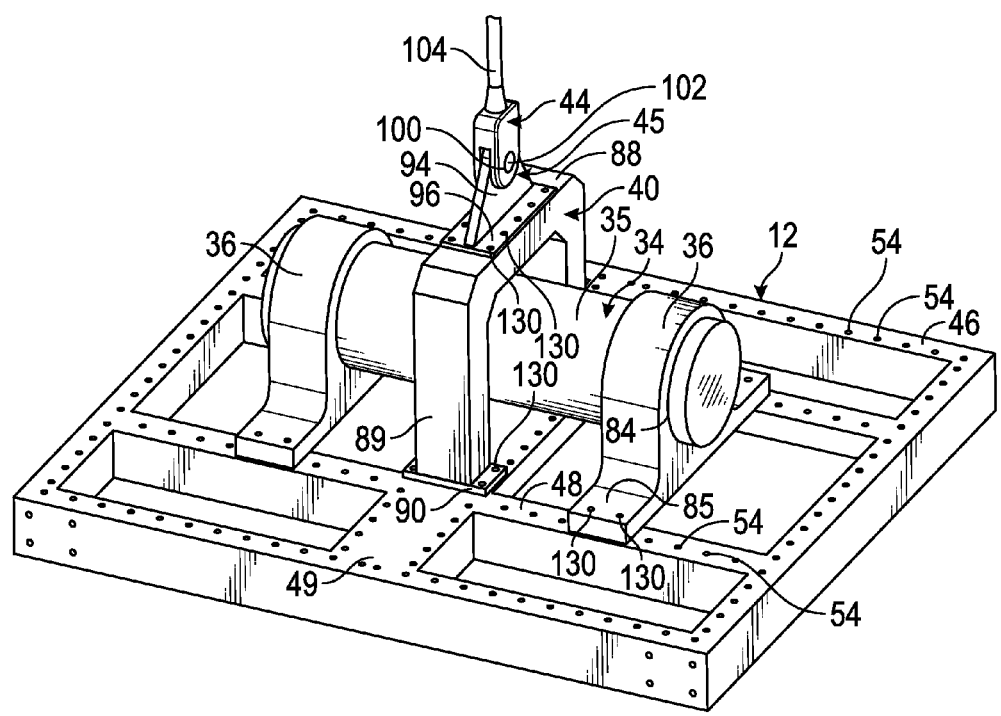

FIGS. 10 to 12 illustrate some of the steps of assembling one embodiment of the equipment assembly of FIG. 7. FIG. 10 depicts a base frame 12 with subsea electronics module (SEM) assembly 34 attached centrally to the top of base frame 12. SEM assembly 34 is positioned over the base frame 12 as indicated by the dotted lines in FIG. 1A and then lowered onto the frame so that the base flanges 85 at opposite ends of the SEM assembly span the gap between cross bars 48 on opposite sides of central cross bar 49, with each pair of openings 86 aligned with a respective pair of openings in respective cross bars 48. SEM assembly 34 is then secured in position by bolts or screw fasteners 130 extending through aligned openings 86, 54, supporting subsea electronics or equipment module (SEM) 35 at a raised position above base frame 12.

In the step of FIG. 11, a low support 40 is positioned to extend over a central portion of SEM 35, with foot plates 90 positioned at spaced locations on central cross bar 49 with openings 98 in the foot plate aligned with respective openings 54 in the two rows of openings on opposite sides of cross bar 49. Fasteners 130 can then be used to secure each of the base plates or foot plates 90 to the central cross bar, securing low support 40 centrally on central cross bar 49 of base frame 12. In one embodiment, cable clevis 44 is then secured to the top member 88 of the low support, with base plate 96 positioned centrally on top member 88 with fastener openings 98 aligned with respective mounting holes 91 and fasteners 130 extending through the aligned holes 98, 91 to secure the cable clevis to top member 88. Deployment cable 104 is attached to extend upward from cable clevis 44.

In FIG. 12, additional superstructure devices are attached to the assembly of FIG. 11, specifically a fixed cable termination 18 and a cable connector manifold 24 with tall end brackets 25. Tall end brackets 25 are of height corresponding to the height of opening 63 so that connector units 110 are aligned with window or opening 63 when the cover member or cowling is positioned over the assembly. Fixed cable termination 18 may be positioned adjacent a leg 89 of low support 40. In some embodiments, fixed cable termination may be positioned at other convenient locations on base frame 12. As seen in FIG. 1A, base plate 106 of fixed cable termination 18 may be positioned over base frame 12 in alignment with one end of central cross bar 49, and lowered onto the frame with the base plate 106 positioned on cross bar 49 with the fastener openings or holes 108 aligned with respective mounting holes 54 in the rows of openings on opposite sides of the cross bar 49. Cable termination 18 is then secured in position by suitable fasteners 130 extending through the aligned openings 108 and mounting holes 54.

Cable connector manifold 24 may be positioned with the foot plates 112 of the two tall end brackets 25 positioned over adjacent end portions of the two cross bars 48, as indicated by the dotted lines in FIG. 1A, then lowered onto the cross bars so that the openings 114 in foot plates 112 are aligned with respective openings or mounting holes 54 in the respective cross bars. The manifold is then easily secured in place via fasteners or bolts 130 extending through aligned openings or holes 114, 54.

In addition to the components installed on the base frame 12, in some embodiments additional superstructure components, for example swivel cable termination 16 and cable connector manifold 27 with short end brackets 30, may be installed on other available locations on base frame 12. For example, as illustrated in FIG. 1A, base plate 15 of swivel cable termination 14 may be secured to opposite end portions of cross bars 48 to the tall cable connector assembly 24, with the cable 109 extending in the opposite direction from connector units 110, as indicated in dotted lines in FIG. 1A. Base plate 15 is secured by suitable fasteners extending through holes 76 at opposite ends of base plate 15 and aligned fastener openings or mounting holes 54 in the respective cross bars 48. Swivel cable termination 16 may be suitably positioned to extend out through cowling opening 65 to connect to cable 109. Short cable connector assembly 27 may be secured to base frame 12 to face in the opposite direction to fixed cable termination 18 and perpendicular to swivel cable termination 17 and tall cable connector 24, as indicated in in dotted outline in FIG. 1A. Foot plates 116 are positioned to span the gap between one cross bar 48 and the adjacent part of peripheral frame member 46, and the cable connector manifold 27 is secured in place by suitable fasteners or bolts 130 extending through openings 118 at one end of each of the foot plates 116 and aligned openings 54 in cross bar 48, and openings 118 at the opposite ends of each of the foot plates and aligned openings 54 in peripheral frame member 46. Short end brackets 30 are of a height equivalent to the height of window or opening 62 in cowling side wall 56.

Figure 13:
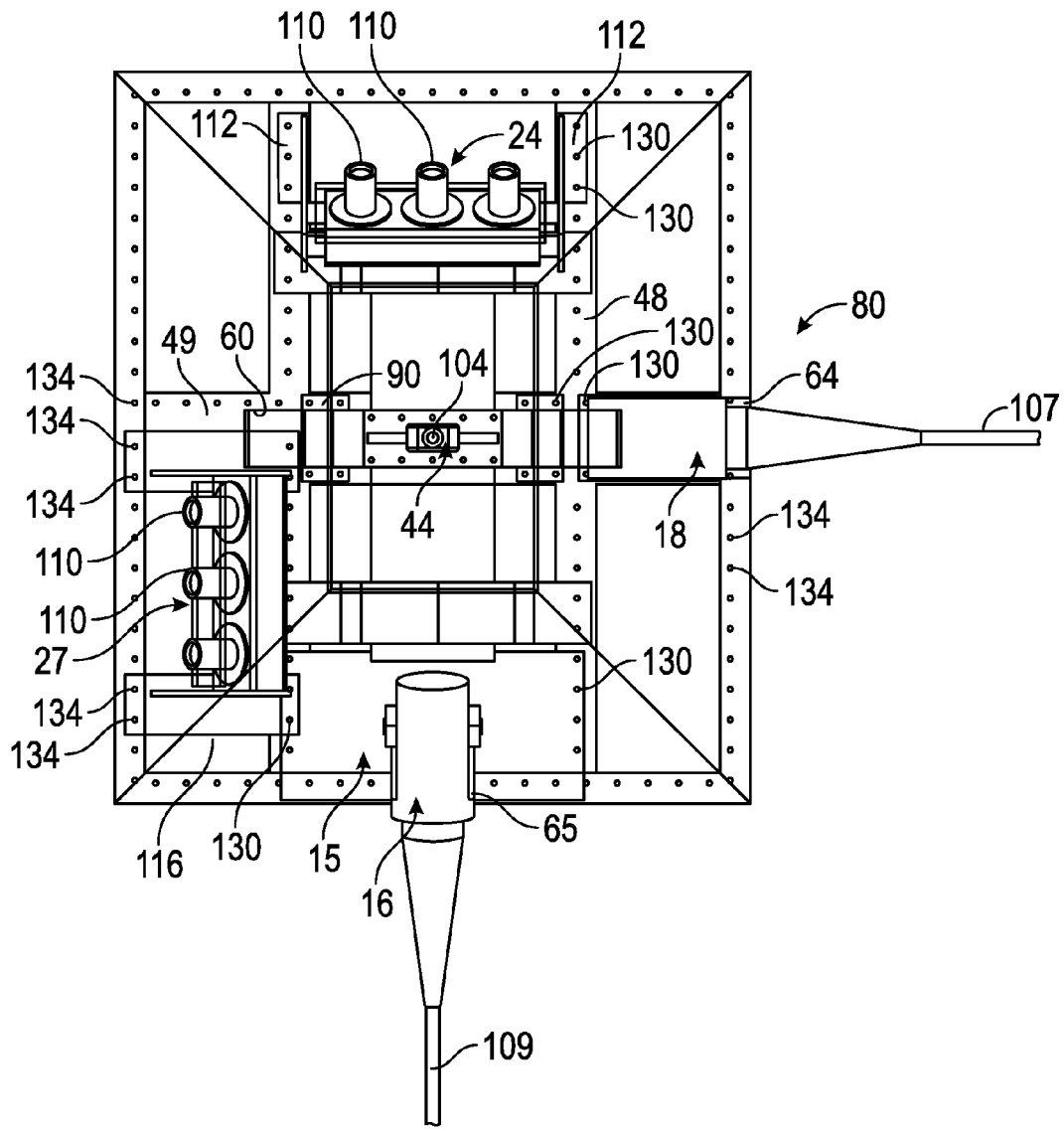
FIG. 13 is a top plan view of the subsea equipment assembly of FIG. 7, with the cowling shown transparent to reveal all assembled components on the frame.

Once the components are all installed on base frame 12, cowling 38 is lowered over the assembled components so that the rim 67 rests on top of peripheral frame member 46, with the openings 64 and 65 aligned with the swivel cable termination 17 and fixed cable termination 18, respectively, as best illustrated in FIG. 13. In FIG. 13, the cowling is shown transparent to reveal the assembled components enclosed in the cowling. In some embodiments, superstructure devices or components which have base or foot plates resting on the outer peripheral frame member 46 may be initially secured by fasteners only to adjacent cross bars, leaving the openings free for subsequent securing to the peripheral frame member via fasteners 134 extending through the openings 66, 68 in the cowling, any intervening base plate openings, and into the fastener openings or mounting holes 54 (which may be threaded or unthreaded, depending on fastener type) in the peripheral frame member 46, as seen in FIG. 13. Once the cowling is secured, lowering cable 104 extends out of the top slot or opening 60, and cable connector units 110 of the low and high cable connector manifolds extend out of respective windows 62 and 63. When lowering wire cable 104 is released, it can be swiveled down into the cowling recess below the top wall of the cowling, for increased snag resistance.

The frame assembly or subsea node installation 80 may be installed offshore at any desired node location with a shore bound submarine cable for power, control, and monitoring or the like (e.g. cable 107 or 109). Scientific, oil field, or military instruments or systems may be plugged into the arrays of connectors in connector manifolds 24 and 27.

Figure 14:
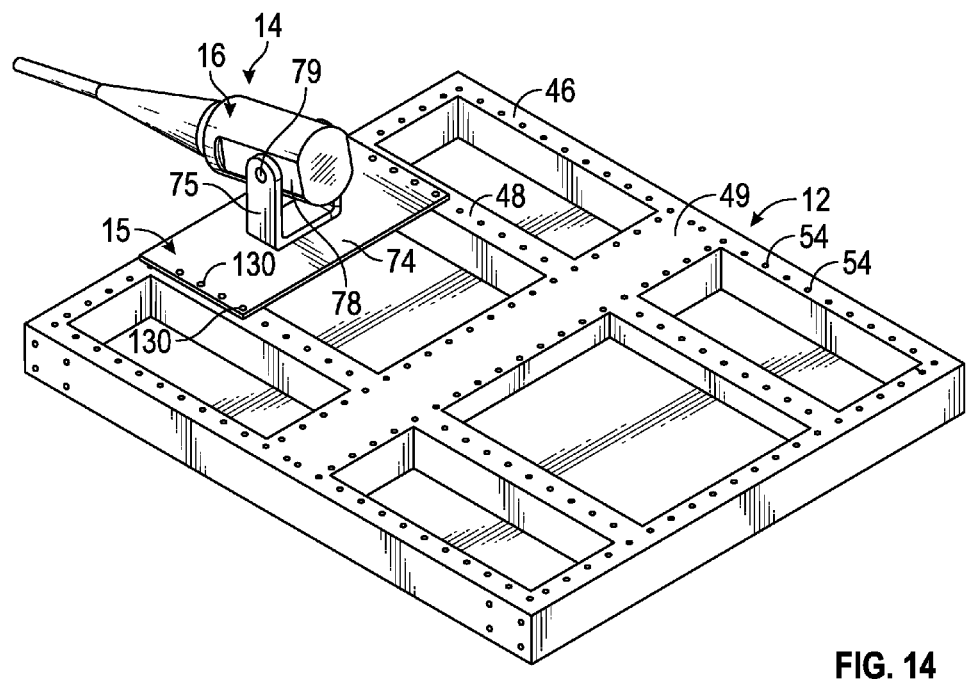
FIGS. 14 to 18 illustrate successive steps of assembling one embodiment of the equipment assembly of FIG. 8.
Figure 15:
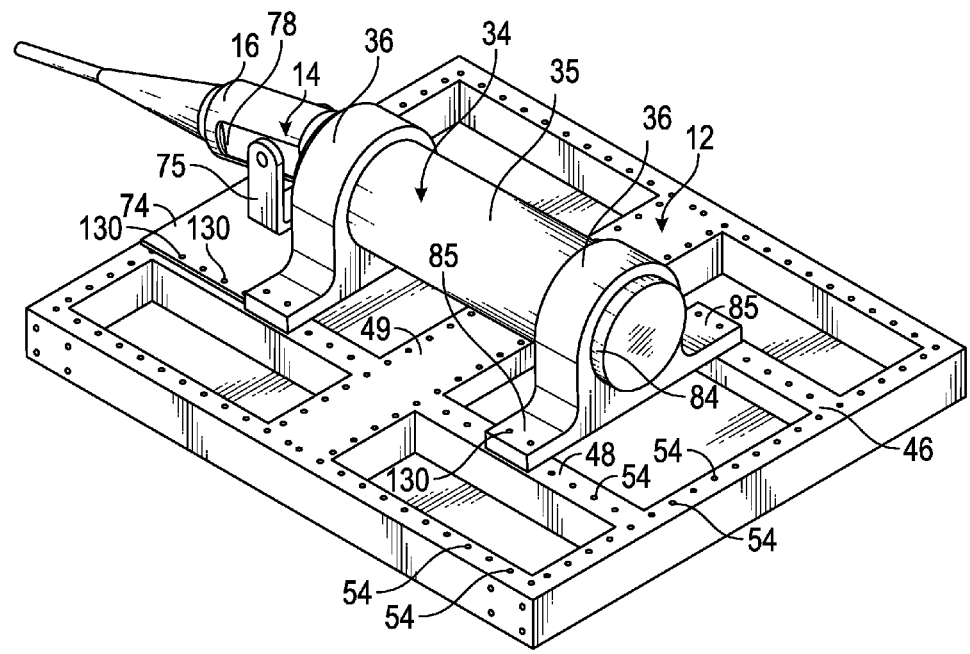
Figure 16:
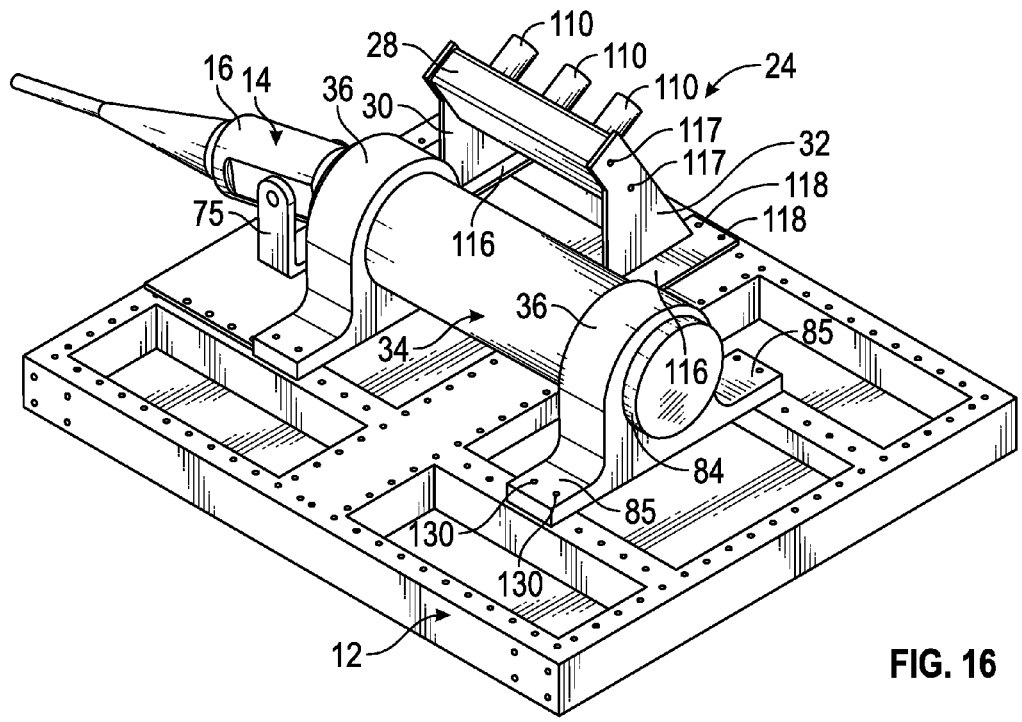
Figure 17:
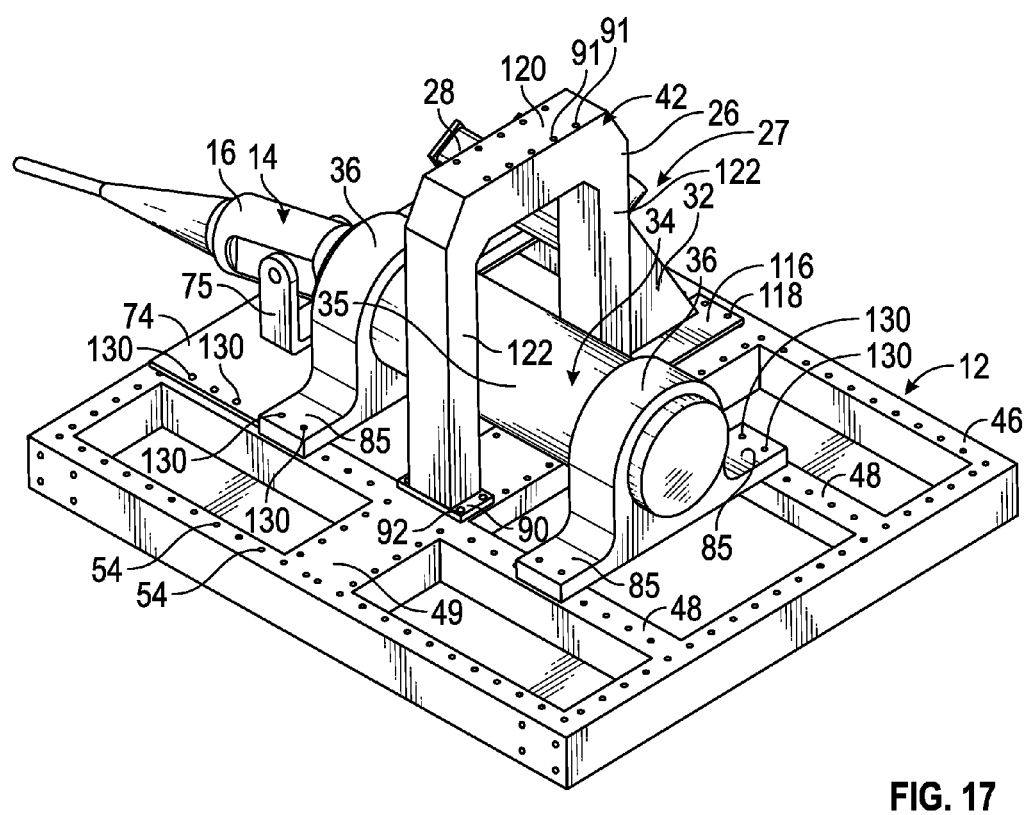
Figure 18:
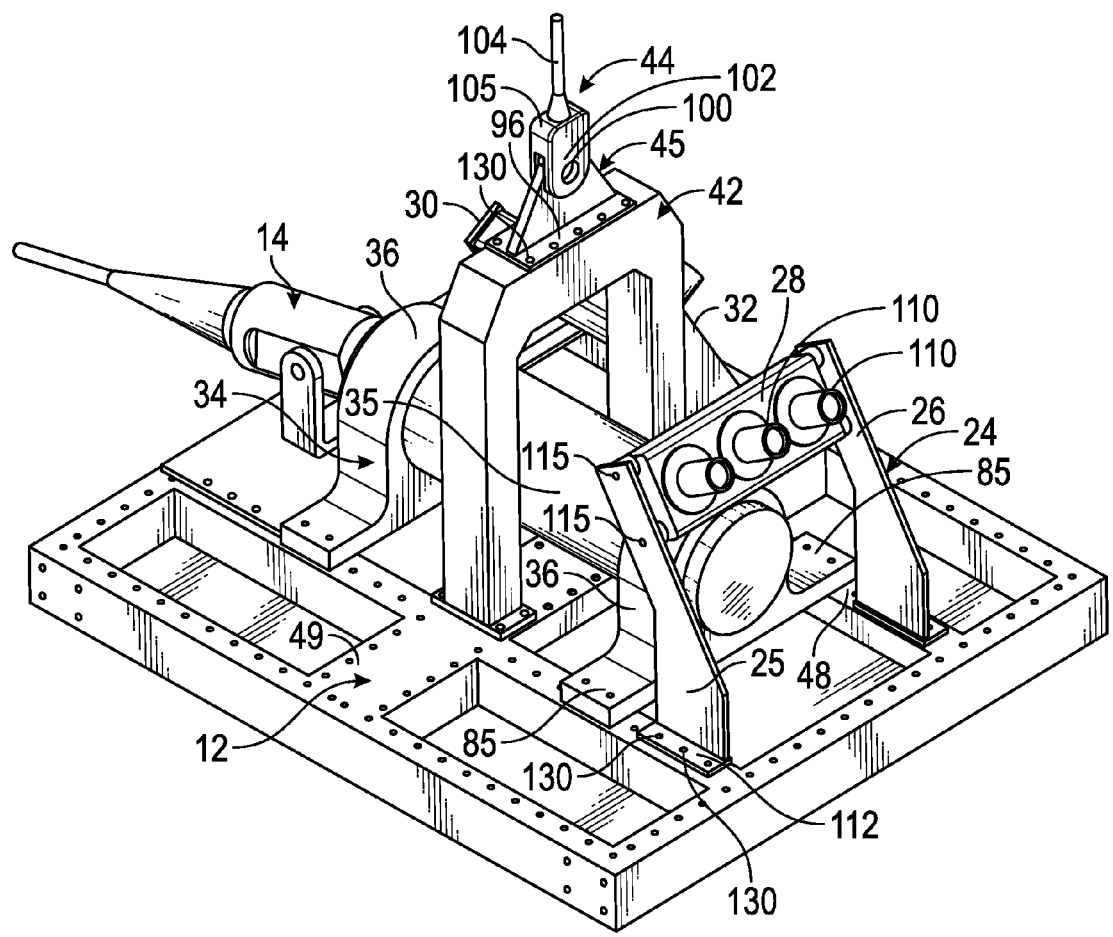

FIG. 8 illustrates a second example of a cable or rope-lowered subsea equipment assembly or node installation 82 using the components of the modular frame system of FIGS. 1 to 5. This installation is similar to the installation of FIGS. 7 and 10 to 13, apart from the replacement of low support 40 with high support 42. In some embodiments, the installation 82 may be assembled as generally illustrated in FIGS. 14 to 18. In this example, installation or equipment assembly 82 includes cowling 38 attached to base frame 12. End swivel cable termination 14 is attached on one side of base frame 12 (FIG. 14). SEM 34 is attached generally across the center of the frame adjacent swivel cable termination 14 (FIG. 15). Connector assembly 27 is attached to one side of base frame 12 adjacent one side of SEM 34 (FIG. 16), opposite end swivel termination 14. High support 42 is attached over the center of SEM 34, in a similar manner to low support 40 in the previous example (FIG. 17). Cable clevis 44 is then secured to the top member 120 of high support 42, and high connector manifold 24 is secured at the opposite end of SEM from swivel cable termination 14 (FIG. 18). Cowling 38 is then placed over the assembled components and secured to the base frame in a similar manner to the previous example. Additional components may be mounted one the frame prior to attachment of the cowling if needed, depending on system requirements.

Figure 19:
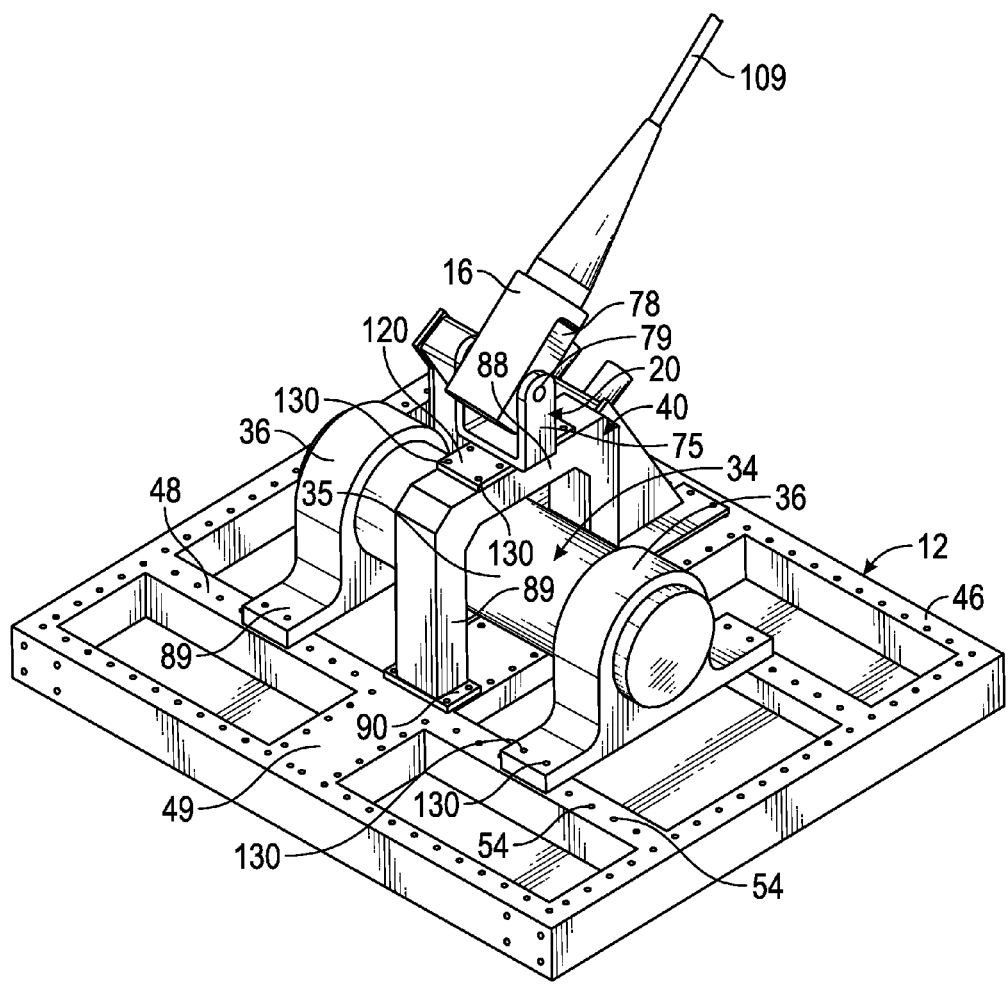
FIG. 19 illustrates an intermediate step of assembling one embodiment of the assembly with a top cable swivel as illustrated in FIG. 9.
Figure 20:
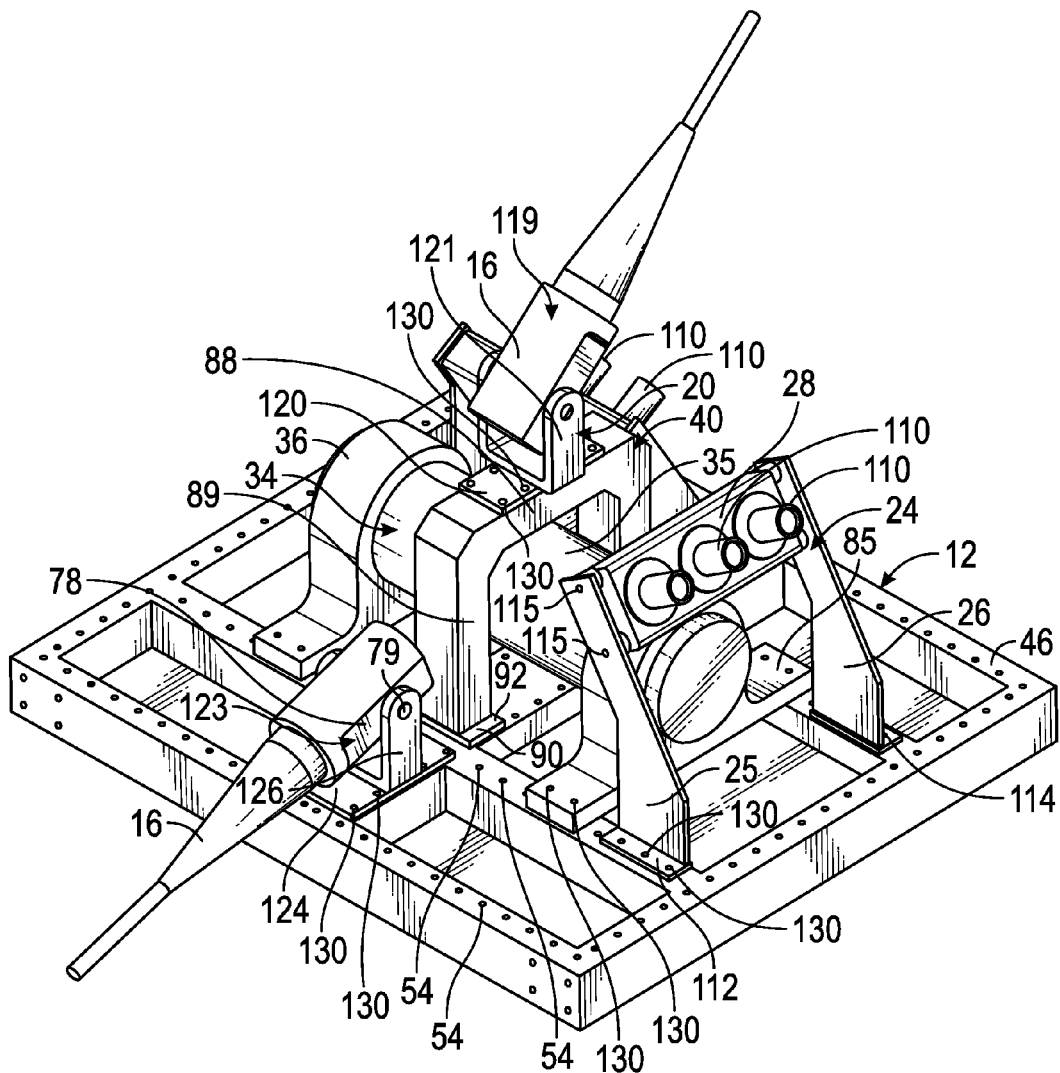
FIG. 20 illustrates the interior components of the assembly of FIG. 9 with the top cover or cowling removed.

FIG. 9 illustrates another example of a subsea equipment assembly or node 83 having a top cable swivel using components of the modular frame system of FIGS. 1 to 3 with the modified cowling or cover member 70 of FIG. 6 with a wider top slot 72. Wider top slot 72 may allow a cable swivel termination 16 to swivel within wider top slot 72. FIGS. 19 and 20 illustrate two intermediate stages in assembling one embodiment of the assembly 83 illustrated in FIG. 9. FIG. 19 illustrates a SEM 34 installed over the center of base frame 12 as in the previous embodiments, with low support 40 attached over the center of SEM vessel 35 as in the example of FIG. 11. However, in this case, a yoke top mount 20 is attached to the top member 88 of low support 40, rather than cable clevis 44, and cable swivel termination 16 may attach atop yoke mount top 20 for termination of subsea electrical, optical, or electro-optical cable 109. Wires or fibers in cable 109 may be connected in a conventional manner to other equipment, cables, or the like inside the equipment assembly or inside SEM vessel 35. Cable connector manifold 27 is also secured to the base frame in FIG. 19, in a similar manner to that described above in connection with FIG. 17.

FIG. 20 illustrates a subsequent step of assembling one embodiment of the assembly illustrated in FIG. 9 with a cable swivel termination 16 located on top of low support 40. In this step or stage, another cable swivel termination 16 and a cable connector manifold 24 are connected to base frame 12. Second cable swivel termination 16 is located on one end of central cross bar 49 with a connected cable 109 extending off one side of base frame 12. Cable connector manifold 24 may be located adjacent one end of SEM assembly 34. Cable connector manifold 24 may include similar features as described for FIG. 12 above.

The assembly or installation 83 of FIG. 9 may be lowered by cable 109 itself, rather than a separate lowering rope or wire cable, or may be deployed between two cable spans.

The subsea installation system of the above embodiments is modular and can be readily configured as needed for various numbers of connectors and one or more cables. One or more cable connector manifolds with two, three, or more sockets or connector units 110 may be installed, depending on system requirements, along with one or more cable terminations, and any suitable system lowering and lifting hardware such as cable clevis 44 or the like. SEM vessel or equipment module 35 may contain any desired electronic, fiber optic, or electro-optical equipment depending on the type of installation. It may be configured for deployment by a lowering robe or cable 104 as in FIG. 7 or 8, for example, or may be deployed between two cable spans and lowered by the cable 109 itself (e.g. as in FIG. 9). The modular base frame is common to all installations and has multiple cross bars along with a peripheral frame member with multiple mounting holes 54 along all frame top surfaces, providing flexibility in securing components in many different possible configurations. This reduces installation expense since it avoids the need for custom designed node frames for each specific subsea system. The components of the modular installation system of the above embodiments may be supplied as off-the-shelf items or an off-the-shelf installation kit to serve as a convenient platform for supporting a wide variety of different system requirements.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. A modular subsea equipment assembly, comprising:
   a modular base frame;
   a plurality of modular superstructure devices configured for selective attachment to the modular base frame in a plurality of different possible configurations of two or more modular superstructure devices, each modular superstructure device comprising a mounting device for supporting or attachment to a respective component of an underwater system, and a base mount configured for attachment to the upper surface of the base frame;
   a cover member of trawl-resistant shape having a peripheral rim configured for attachment to the base frame and enclosing the superstructure devices on the base frame;
   the modular base frame comprising a frame member forming an outer periphery of the base frame, and a plurality of cross bars extending between opposite portions of the frame member in one or more directions, the frame member and cross bars having at least upper surfaces each having a plurality of connection points for attaching selected modular superstructure devices to the base frame in a plurality of different possible configurations, wherein the connection points on the frame member and cross bars together and independently form multiple arrays of connection points of different sizes and with different numbers of connection points;

each base mount of the respective modular superstructure devices including an array of connection points configured for alignment with connection points of any selected array on the modular base frame of size matching the array of connection points on the respective base mount;

a plurality of fasteners configured for attachment of respective base mounts of selected superstructure devices to the base frame via aligned connection points of the respective base mount and the selected matching array of connection points on the base frame; and wherein the cover member is of truncated square pyramid shape having two inclined side walls, two inclined end walls, a top wall, and an inwardly extending, peripheral rim extending around the lower ends of the end walls and side walls, the peripheral rim of the cover member being of shape and dimensions substantially matching those of the peripheral frame member and having a plurality of connection points configured for alignment with matching connection points on the peripheral frame member and for attachment to the base frame via fasteners at some or all of the aligned cover member and peripheral frame member connection points when the cover member is engaged over equipment mounted on the base frame with the inwardly extending peripheral rim seated on top of the peripheral frame member.

2. The assembly of claim 1, wherein the connection points on the base frame comprise threaded or unthreaded mounting holes, the connection points on the superstructure devices comprise openings for alignment with the mounting holes, and the fasteners are selected from the group consisting of screws, bolts, pins, nails, and rivets.

3. The assembly of claim 1, wherein the base frame has a rectangular peripheral frame member having side portions and end portions, and the cross bars comprise at least two first cross bars extending between opposite end portions of the frame and at least one second cross bar extending between opposite side portions of the frame and intersecting the first cross bars at cross-over points.

4. The assembly of claim 3, wherein connection points are provided at equally spaced intervals around the peripheral frame and along each cross bar.

5. The assembly of claim 4, wherein there are two first cross bars spaced a predetermined first distance apart and each spaced a predetermined second distance from the respective adjacent side portion of the base frame, the first distance being different from the second distance, at least some of said superstructure devices have mounting bases with connection points spaced apart by said first distance and at least some of said superstructure devices have mounting bases with connection points spaced apart by said second distance.

6. The assembly of claim 4, wherein at least one cross bar is wider than the other cross bars and has two spaced rows of equally spaced connection points along its length, the two rows being spaced apart by a third distance less than the first and second distances, and at least some of said superstructure devices have mounting bases with connection points spaced apart by said third distance.

7. The assembly of claim 1, wherein the plurality of modular superstructure devices comprise at least one or more first modular superstructure devices selected from the group consisting of: swivel cable terminations, fixed cable terminations, cable connector manifolds, U-shaped supports, and subsea electronics module (SEM) end support brackets.

8. The assembly of claim 7, wherein the plurality of modular superstructure devices further comprise one or more second modular superstructure devices configured for attachment to the support frame at a raised height above the support frame via one or more of the first modular superstructure devices.

9. The assembly of claim 8, wherein the one or more second modular superstructure devices are selected from the group consisting of a subsea electronics module (SEM), a lowering and lifting cable clevis, and a swivel cable termination.

10. The assembly of claim 8, wherein the U-shaped supports comprise at least a tall U-shaped support and a short U-shaped support which is shorter in height than said tall U-shaped support, each U-shaped support having an upper mounting member and a pair of legs depending from the upper mounting member, the upper mounting member having an array of connection points for attaching a selected second modular superstructure device to the U-shaped support, and a pair of foot plates, each foot plate attached to the lower end of a respective leg, the foot plates each having connection points and comprising said mounting base for attaching the U-shaped support to the base frame.

11. The assembly of claim 10, wherein the selected second modular superstructure devices further comprise a cable clevis and a cable swivel mount for selective attachment of a lowering and lifting cable to a selected U-shaped support.

12. The assembly of claim 1, wherein the connection points on the base frame comprise threaded or unthreaded mounting holes, and the connection points on the superstructure devices and cover member comprise openings for alignment with the mounting holes.

13. The assembly of claim 12, wherein the cover member has spaced openings around base portions of the side and end walls which are aligned with respective openings around the peripheral rim of the cover member for engagement with fasteners extending through the openings in the side and end walls and aligned openings in the peripheral rim and into respective aligned mounting holes in the peripheral frame member of the base frame.

14. A modular base frame for holding subsea equipment comprising:

a peripheral frame member forming an outer periphery;

a plurality of cross bars extending between opposite portions of the frame member in one or more directions to define spaces between adjacent cross bars and between the cross bars and adjacent portions of the frame member, the frame member and cross bars having upper and lower surfaces;

the upper surfaces of the frame member and cross bars each having a plurality of equally spaced connection points extending along at least substantially the entire length of the respective frame member and cross bars for attaching selected modular superstructure devices to the base frame in a plurality of different possible configurations, wherein the connection points on the frame member and cross bars together and independently form multiple arrays of connection points of different sizes and with different numbers of connection points;

the modular base frame being configured for selective attachment to different size base members of selected modular superstructure devices via a plurality of fasteners, each base member including an array of connection points configured for alignment with connection points of any selected array of connection points on the base frame of matching size to the array of connection points on the respective base member, and the aligned connection points being configured for engagement by respective fasteners; and the connection points on the upper surfaces of the frame member and cross bars comprise mounting holes for alignment with respective connection points comprising openings on the base members, the mounting holes being threaded and configured for receiving threaded fasteners.

15. The modular base frame of claim 14, wherein at least the upper surfaces of the peripheral frame member and cross bars comprise flat, co-planar mounting surfaces.

16. The modular base frame of claim 14, further comprising a base plate secured across the lower surfaces of the peripheral frame member and cross bars.

17. The modular base frame of claim 14, wherein the peripheral frame member is rectangular and has opposite side portions and end portions, and the cross bars comprise at least one first cross bar extending between opposite end portions of the peripheral frame member and at least one second cross bar extending between opposite side portions of the peripheral frame member and intersecting the first cross bar at a crossover point.

18. The modular base frame of claim 17, wherein at least one cross bar is wider than the peripheral frame member and has two spaced rows of equally spaced connection points extending along its length.

19. The modular base frame of claim 18, wherein said at least one cross bar comprises a single, centrally located, second cross bar extending between opposite side portions of the peripheral frame member.

20. The assembly of claim 17, wherein there are two first cross bars spaced a predetermined first distance apart and each spaced a predetermined second distance from the respective adjacent side portion of the base frame, the first distance being different from the second distance.

21. The assembly of claim 20, wherein there is one centrally located second cross bar spaced from opposite end portions of the peripheral frame member.

22. A method of assembling multiple different selected configurations of subsea equipment on a modular base frame having an upper surface, a peripheral frame member and one or more cross bars extending between opposite portions of the peripheral frame member, the frame member and cross bar or bars having a plurality of equally spaced connection points extending along at least a major portion or the entire length of the upper surfaces of the respective members, the method comprising:

positioning one, two or more modular superstructure devices of one or more different types at selected locations on the upper surface of the modular base frame with an array of spaced connection points on the base mount of each modular superstructure device aligned with a selected matching array of spaced connection points on the upper surface of the base frame, and securing each modular superstructure device to the frame via the aligned connection points;

wherein the connection points on the base frame are mounting holes and the connection points on each mounting base are openings for alignment with selected mounting holes, and the step of securing each modular superstructure device to the base frame comprises extending fasteners through each opening on the mounting base of the respective superstructure device into the respective aligned mounting hole.

23. The method of claim 22, wherein the modular superstructure devices comprise at least fixed and swivel cable terminations, end brackets configured for supporting subsea equipment modules, pairs of right and left supporting brackets for supporting cable connector manifolds extending between the supporting brackets, the cable connector manifolds carrying two or more subsea connector units for subsea mating engagement with mating connector units at the ends of subsea cables, and U-shaped supports for supporting additional devices at a raised height above the base frame, further comprising securing one or more additional modular superstructure devices to one or more raised U-shaped supports after a first set of modular superstructure devices is secured in a selected configuration on the modular base frame, the one or more additional superstructure devices comprising at least a lifting and lowering cable support device.

24. The method of claim 22, further comprising engaging a trawl resistant cover member over selected superstructure devices and any associated equipment modules secured on the base frame with a rim extending around the base of the cover member seated on the peripheral frame member with spaced openings around the rim of the cover member aligned with corresponding spaced mounting holes around the peripheral frame member of the base frame, and securing the rim to the peripheral frame member via fasteners extending through at least some of the openings in the rim into aligned mounting holes in the peripheral frame member.

* * * * *